United States Patent [19]

Main

[11] 4,442,549
[45] Apr. 10, 1984

[54] METER DRIVE CIRCUIT

[75] Inventor: William E. Main, Mesa, Ariz.

[73] Assignee: Motorola, Inc., Schaumburg, Ill.

[21] Appl. No.: 382,753

[22] Filed: May 27, 1982

[51] Int. Cl.³ .............................................. H04B 1/26
[52] U.S. Cl. .................................. 455/211; 307/492;
328/145; 329/146; 329/192; 330/252; 455/155;
455/246; 455/253
[58] Field of Search ................ 455/154, 155, 194, 205,
455/210, 211, 229, 308, 239, 246, 253; 328/145;
307/492; 329/145, 146, 192; 330/252

[56] References Cited

U.S. PATENT DOCUMENTS

| | | | |
|---|---|---|---|
| 2,515,187 | 7/1950 | Bliss | 329/146 |
| 2,662,978 | 12/1953 | Sunstein | 329/146 |
| 3,403,347 | 9/1968 | Stull, Jr. | 329/192 |
| 3,423,682 | 1/1969 | Cauchois | 328/145 |
| 3,435,353 | 3/1969 | Sauber | 329/146 |
| 3,605,027 | 9/1971 | Nichols et al. | 328/145 |
| 3,668,535 | 6/1972 | Lansdowne | 329/192 |
| 3,673,499 | 6/1972 | Avins et al. | 455/205 |
| 3,678,405 | 7/1972 | Avins | 330/260 |
| 4,247,949 | 1/1981 | Watanabe et al. | 455/154 |

*Primary Examiner*—Marc E. Bookbinder
*Attorney, Agent, or Firm*—Michael D. Bingham

[57] ABSTRACT

A circuit and method for producing a signal the magnitude of which varies with the logarithm of an input signal supplied to a plurality of cascaded differential amplifier stages each having substantially equal gain. As particular ones of the stages go into limiting the DC rectified voltage produced at the differential common node of each of the stages is detected to produce a plurality of currents. These currents are summed to the input of a current turn-around circuit which produces the signal at an output.

10 Claims, 5 Drawing Figures

METER DRIVE CIRCUIT

BACKGROUND OF THE INVENTION

The present invention relates to a circuit and method for providing a signal strength sensitive current and, more particularly, to a circuit and method for producing a meter drive signal or the like in an intermediate frequency (IF) limiter stage, the magnitude of which varies linearly with the logarithm of an input signal supplied to the IF limiter stage.

Prior art receivers such as FM receivers having multi-stage IF limiter stages are well known in the art. Further, there are prior art receivers comprising such IF limiter systems that also include meter drive circuits which produce a current output signal that, among other things, may be utilized to drive a signal strength indicating meter. The current output signal may also be used as an aid in production alignment of such receivers as well as providing other functions such as squelch control.

One prior art meter drive circuit which has been incorporated into FM receivers derives the current drive signal from the IF limiter system of the receiver by capacitively coupling separate rectifier circuits to one or more of the several amplifier stages of the IF limiter respectively. The amplified signals from the individual amplifier stages of the IF limiter are measured by the individual rectifier circuits which peak rectify the signal appearing at the output of the particular amplifier stage by essentially clamping the peak carrier frequency amplitude at a predetermined signal level. Hence, as the carrier frequency amplitude increases, the average DC value of the carrier frequency also increases. The clamped signal is then applied to the base of a transistor which provides an output current drive signal that includes both the DC and carrier frequency components. In order to provide a useful signal, the carrier frequency component of the aforementioned output signal must be filtered. Because of the relatively large carrier frequency component, strict filter requirements are required which is undesirable due to, among other reasons, the cost of the required filter components.

Hence, there is a need for a much simpler and cheaper circuit and method for deriving a signal that is sensitive to the strength of an input signal supplied to a receiver and which requires less filtering than prior art meter drive circuits.

SUMMARY OF THE INVENTION

Accordingly, it is an object of the present invention to provide an improved circuit and method for providing a signal having a magnitude which varies linearly with the logarithm of an input signal supplied to the circuit.

Another object of the present invention is to provide a circuit and method for providing accumulated detection as particular stages of a multi-stage IF limiter goes into limiting to provide an output signal which is a logarithmic function of the input signal level supplied to the IF limiter system.

Still another object of the present invention is to provide an improved meter drive circuit for use in an FM receiver for producing an output signal the amplitude of which varies linearly with the logarithm of the input signal supplied to the IF limiter of the FM receiver.

A further object of the present invention is to provide a meter drive circuit suitable to be realized in monolithic integrated circuit form in conjunction with an IF limiter to produce an output signal the magnitude of which varies linearly with respect to the logarithm of the IF signal supplied to the IF limiter system.

In accordance with the above and other objects there is provided a circuit and method for producing an output signal from a plurality of cascaded differential amplifier stages comprising the steps of providing circuit means responsive to the rectified DC voltage level produced at a differential common node of each differential amplifier stage as it goes into a limiting state for producing a current the magnitude of which varies linearly with the logarithm of the signal supplied to the amplifier stages and then summing the individual currents produced from each individual amplifier stage.

DETAILED DESCRIPTION OF THE PREFERRED EMBODIMENTS

Figure 1:
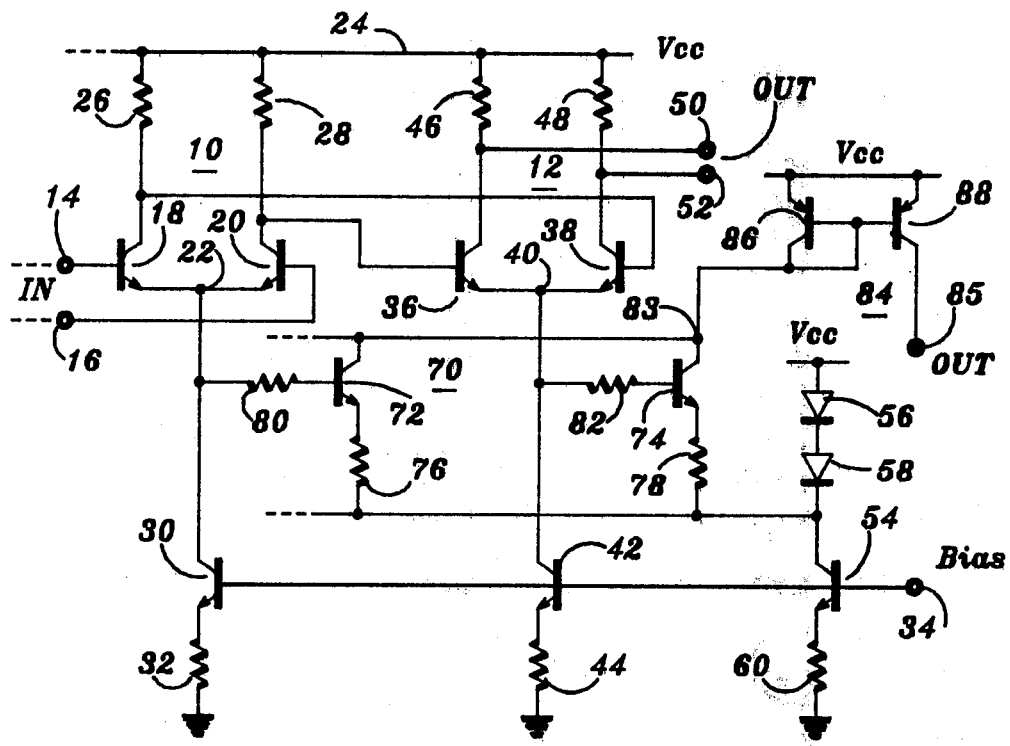
FIG. 1 is a schematic illustrating the last two stages of an IF limiter system incorporating the detection circuit means of the present invention.

Turning to FIG. 1, there is illustrated two cascaded differential transistor amplifier stages 10 and 12 which may comprise a portion of a multi-stage intermediate frequency (IF) limiter system the operation of which is well known to those skilled in the art. For example, amplifier stage 10 may be an intermediate stage and amplifier 12 the last stage of a five stage IF limiter system that is suited to be manufactured in monolithic integrated circuit form. Generally, all of the individual stages have the same gain transfer characteristics. An IF limiter system such as illustrated in FIG. 1 is the MC3357 Low Power FM IF Circuit manufactured by Motorola, Inc.

An IF input signal is typically supplied to the first differential stage (not shown) of the IF limiter system. The differential outputs from each preceding stage is differentially applied to the succeeding differential stage. Hence, the differential outputs from a preceding amplifier stage are supplied to inputs 14 and 16 of intermediate stage 10. Differential amplifier stage 10 includes transistors 18 and 20 each having respective emitters differentially connected to common node 22. The collectors of transistors 18 and 20 are coupled to a source of operating potential $V_{CC}$ that is supplied to power supply conductor 24 via respective load resistors 26 and 28. A current source comprising transistor 30 and resistor 32 is provided as understood. Transistor 30 is biased by a bias potential supplied at terminal 34 to the base thereof.

The differential outputs of stage 10 are supplied to respective bases of transistors 36 and 38 comprising differential amplifier stage 12. Similarly, with respect to stage 10, transistors 36 and 38 are differentially connected at common node 40 to current source transistor 42 and resistor 44. Differential outputs are supplied across respective load resistors 46 and 48 to outputs 50 and 52 of the IF limiter system. As illustrated, the base of current source transistor 42 is biased at the same potential as the base of current source transistor 30 of stage 10 from the bias circuit which may include transistor 54 and diodes 56, 58 and resistor 60.

In operation, the IF signal supplied to the input of the IF limiter system is amplified in each successive stage to provide an output signal which differentially drives the next succeeding stage. Typically, the IF signal is sufficient to at least cause the last stage of the IF limiter system to go into limiting. Thereafter, as the amplitude of the IF signal increases, each preceding stage is caused to go into limiting in succession. Typically, the outputs of the IF limiter system are utilized to drive a multiplier, as is understood, whereby the FM signal is detected. The present invention which will be described may be included with such an IF limiter system. For purposes of describing the present invention, it is assumed that each of the individual differential amplifier stages of the IF limiter system have equal gain characteristics.

The IF limiter system illustrated in FIG. 1 includes a meter drive circuit means 70 of the present invention which is utilized for deriving a signal strength sensitive current output signal. In the preferred embodiment, meter drive circuit means 70 may be included in a wide band FM receiver although the present invention is not intended to be limited thereto. Meter drive circuit means 70 is illustrated as comprising individual detection circuit means for detecting a direct current (DC) rectified voltage at the differential common node as each individual amplifier stage of IF limiter system goes into limiting. It is to be understood that meter drive circuit means 70 may include additional detection circuit means which may be connected with those additional differential stages of the IF limiter system that are not shown in like manner as those shown.

As illustrated, meter drive circuit means 70 comprises detection transistors 72 and 74 which are coupled to respective amplifier stages 10 and 12. The emitters of transistors 72 and 74 are commonly coupled via respective emitter resistors 76 and 78 to a common bias potential that is supplied at the collector of transistor 54. The base of transistor 72 is coupled to common node 22 of differential amplifier stage 10 via resistor 80. Similarly, the base of transistor 74 is coupled to the common node 40 of amplifier stage 12 through resistor 82. The collectors of transistors 72 and 74 are connected together at node 83 to the input of a current turn-around circuit 84. The output of the current turn around circuit 84 is supplied to output terminal 85. Current turn around circuit 84, comprising transistors 86 and 88, is well known to those in the art. As aforementioned, each individual stage of the IF limiter system may have a detecting circuit comprising a detector transistor and associated circuitry which is coupled in parallel with transistors 72 and 74.

The method of providing an output current signal at terminal 85 having a magnitude that varies linearly with the logarithm of the input signal applied to the input of the IF limiter system will now be explained fully with respect to FIGS. 2 and 3. Assuming that all of the individual stages of the IF limiter system have equal gain, the accumulated current detection of each stage by meter drive circuit 70 as a particular stage goes into limiting provides an output current which is a logarithmic function of the input signal.

Figure 2:
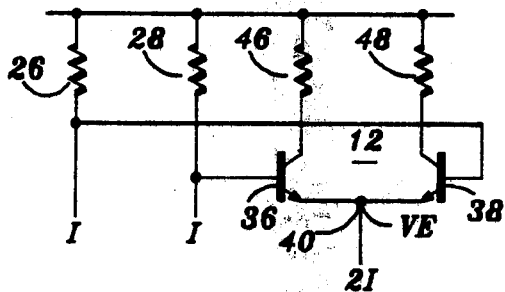
FIG. 2 is a partial schematic illustrating the quiescent operating state of the IF limiter system of FIG. 1.

Turning now to FIG. 2 there is shown differential stage 12 which is differentially driven by preceding stage 10. As illustrated, differential stage 10 is in a quiescent operating state such that equal currents of magnitude I flow through load resistors 26 and 28 respectively. Hence, transistors 36 and 38 of stage 12 will be equally biased to conduct equal currents such that a current of value 2I is sourced from node 40. The voltage $V_E$, as understood, appearing at node 40 is a full wave rectified version of the differential input signal supplied across the base inputs of differential amplifier stage 12. At quiescence, the voltage $V_E$ has a DC level which can be shown to be equal to:

$$V_E(DC) = V_{CC} - I_R - V_{BE} \quad (1)$$

where $I_R$ is the voltage drop across either of the equal valued load resistors of the preceding stage; and $V_{BE}$ is the voltage drop across the base-emitter junction of either one of the two transistors 36 or 38.

As the magnitude of the input signal supplied to the IF limiter system increases, successive stages thereof will begin limiting the amplitude swing of the amplified signal such that a symmetrically clipped signal appears at the respective outputs thereof. The last stage 12 of the IF limiter system goes into limiting first and then the next stage 10, etc.

Figure 3:
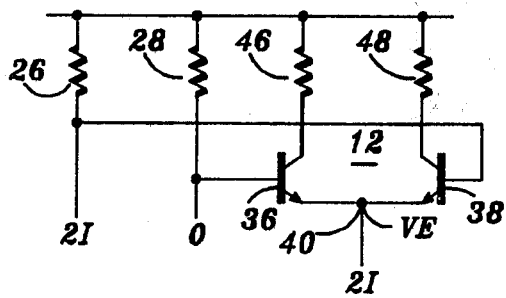
FIG. 3 is a schematic illustrating the limiting operating state of the IF limiter system of FIG. 1.

Turning now to FIG. 3 it is assumed that stage 12 is in limiting and transistors 18 and 20 of stage 10 are in a conducting and nonconducting state respectively. In this condition, it can be shown that the DC level of the full wave rectified voltage $V_E$ is approximately equal to:

$$V_E(DC) = V_{CC} - V_{BE}$$

Hence, as a particular stage of the IF limiter system goes into a limiting state the DC level of the voltage $V_E$ appearing at the differential common node thereof increases by a predetermined value.

The present invention takes advantage of this difference shift in the value of the DC level of $V_E$ to provide an accumulated current signal having a magnitude that varies linearly as the logarithmic of the applied input signal to the IF limiter system. Hence, as the DC level of $V_E$ increases, the individual detection transistors of meter drive circuit 70 are rendered more and more conductive. The currents flowing in the collectors of these transistors are accumulated at node 83 and summed to the input of current turn-around circuit 84. Current turn-around circuit 84 supplies the signal sensitive signal at output terminal 85. As succeeding stages go into limiting, the collector current of the particular detector transistor associated therewith, for example, transistor 74 of stage 12 becomes substantially constant as the value of $V_E$ has reached a constant value.

Thus, what has been described is a circuit and method utilizing the DC shift in a full wave rectified voltage appearing at the differential node of a differential transistor amplifier stage. This shift is detected by circuit means to produce an output when the stage goes into limiting that is a logarithmic function of the input signal level supplied to the amplifier stage.

Figure 4:
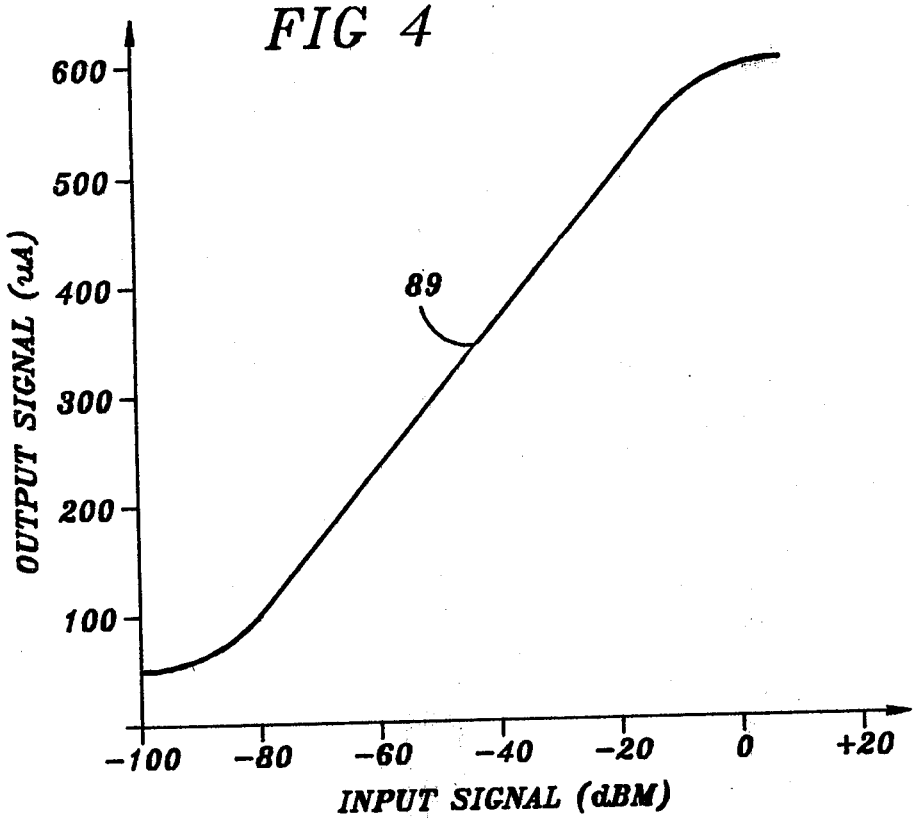
FIG. 4 is a graph illustrating the transfer characteristics of the detection circuit means of the present invention.

A six stage limiter circuit of the type described above has been fabricated in integrated circuit form in which the last five stages contain signal strength sensitive current sinking devices such as transistor 74 and associated circuitry. All of the devices are parallel connected wherein the current is summed at a node and buffered to produce a current that can be utilized, for instance to drive a signal strength meter. FIG. 4 illustrates that the variation of the magnitude of the accumulated current 89 is a linear function of the logarithm of the input signal.

Figure 5:
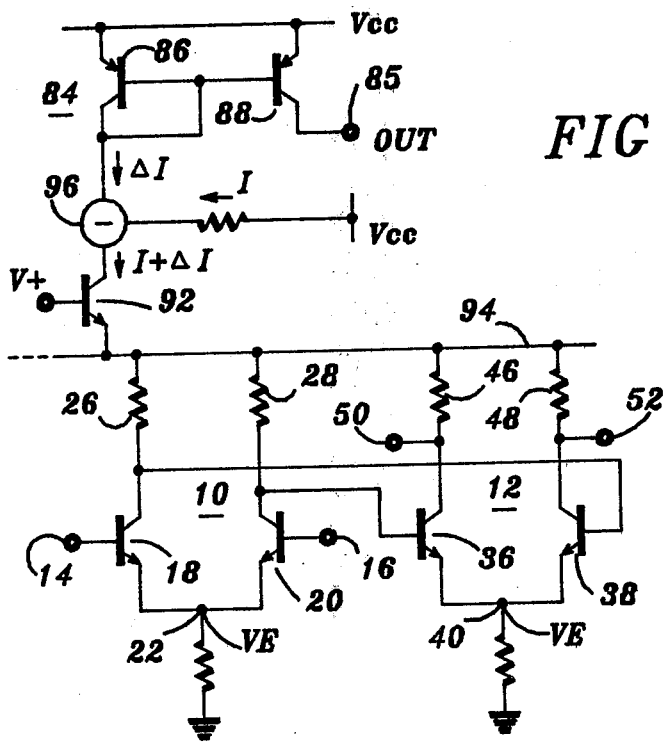
FIG. 5 is a schematic of an IF limiter system incorporating a detection circuit means of a second embodiment of the present invention.

Turning now to FIG. 5, there is illustrated a second embodiment of the invention wherein a current of magnitude $\Delta I$ is produced which is a function of the voltage $V_E$: $V_E$ changing in magnitude as aforedescribed. It is understood that components of FIG. 5 corresponding to like components shown in FIG. 1 have the same reference numerals associated therewith. In operation, transistor 92 is series connected between current turn-around circuit 84 and bias line 94 to provide an operating potential to individual stages 10, 12, etc. of the IF limiter system. Transistor 92 is biased by a bias potential $V+$ at its base.

As aforedescribed, as each differential stage of the IF limiter system goes into limiting, the voltage $\Delta V_E$, the voltage shift in the DC level of the voltage $V_E$, causes a difference current $I + \Delta I$ to flow through transistor 92. Hence, the current $\Delta I$ varies linearly as each stage goes into limiting. A subtractor circuit 96 may be utilized to subtract the quiescent value $I$ of the current flowing through transistor 92 from the total current flowing therethrough such that only the incremental change in the DC current level $\Delta I$ is supplied at output 85.

What is claimed is:

1. A method for producing an output signal the magnitude of which varies linearly with the logarithm of an input signal that is supplied to the input of a plurality of cascaded differential amplifier stages, each stage having a differential amplifier common node associated therewith, comprising the steps of:
   producing a D.C. voltage change at said common node of each of said amplifier stages in response to variations in the magnitude of the input signal;
   detecting said D.C. voltage change at the common node of each of said amplifier stages to provide corresponding current changes;
   accumulating said current changes; and
   supplying said accumulated current changes at an output.

2. In an FM receiver which includes an IF limiter system having a plurality of cascaded, transistor differential stages of substantially equal gain, each stage having a differential stage common node associated therewith, a method for producing an output signal that varies as the logarithm of an input signal supplied to the IF limiter system, comprising the steps of:
   producing D.C. voltage changes at the common nodes of particular ones of said stages of the IF limiter system as said particular stages go into limiting;
   detecting said D.C. voltage changes to provide corresponding current changes; and
   accumulating said current changes to provide the output signal.

3. In an IF limiter system including a plurality of cascaded, transistor differential stages of substantially equal gain, each stage having a differential stage common node, a method for producing an output signal as each stage of the IF limiter goes into limiting which varies linearly with the logarithm of an input signal supplied to the IF limiter, comprising the steps of:
   producing a D.C. voltage change at the common mode of each stage as each stage goes into limiting;
   detecting said D.C. voltage changes to provide corresponding current changes; and
   summing said current changes to produce the output signal.

4. A circuit including a plurality of differential amplifier stages connected in cascade, each of the amplifier stages having substantially the same gain and having a differential stage common node associated therewith, the circuit being responsive to an applied input signal for supplying an output signal the magnitude of which varies linearly with the logarithm of the input signal, comprising:
   circuit means for detecting a DC voltage change at the common nodes of particular ones of the stages as particular stages go into limiting to produce a plurality of current changes;
   summing means for accumulating said plurality of current changes; and
   output circuit means receiving said accumulated current changes for supplying the output signal.

5. The circuit of claim 4 wherein said circuit means includes a plurality of individual transistors each having first, second and control electrodes, said first electrode of each transistor being coupled to a first terminal at which is supplied a bias potential, said second electrode of each transistor being coupled to said summing means, said control electrode of each transistor being coupled to a respective common node of a particular one of the differential amplifier stages.

6. The circuit of claim 5 wherein said output circuit means is a current turn-around circuit having an input and an output, said input being coupled to said summing means, said output being coupled to an output of the circuit.

7. In a FM receiver including an IF limiter having a plurality of substantially equal gain transistor differential amplifier stages connected in cascade to receive an IF input signal, a circuit for producing a signal the magnitude of which varies linearly with the logarithm of the IF input signal, comprising:
   circuit means responsive to particular ones of the differential amplifier stages going into limiting for detecting a DC voltage change produced at a common node of each of said particular differential amplifier stages to produce a plurality of current changes;
   means for summing said current changes; and
   current turn-around means receiving said summed currents for supplying the signal at an output.

8. The circuit of claim 7 wherein said circuit means includes a plurality of individual transistors each having first, second and control electrodes, said first electrode of each transistor being coupled to a first terminal at which is supplied a bias potential, said second electrode of each transistor being coupled to said summing means, said control electrode of each transistor being coupled to a respective common node of a particular one of the differential amplifier stages.

9. An IF limiter system including a plurality of differential transistor stages of substantially equal gain connected in cascade forming an IF limiter, the IF limiter receiving an input signal for supplying a first output signal that is symmetrically clipped, the improvement comprising a circuit responsive to particular ones of the stages going into a limiting mode for supplying a second output signal the magnitude of which varies linearly with the logarithm of the input signal, said circuit comprising:

circuit means responsive to the particular differential amplifier stages for detecting a DC voltage change produced at a common node of each particular differential amplifier stage to produce a plurality of current changes;

means for summing said current changes; and current turn-around means for supplying the second output signal in response to said summed current changes.

10. The circuit of claim 9 wherein said circuit means includes a plurality of individual transistors each having first, second and control electrodes, said first electrode of each transistor being coupled to a first terminal at which is supplied a bias potential, said second electrode of each transistor being coupled to said summing means, said control electrode of each transistor being coupled to a respective common node of a particular one of the differential amplifier stages.

* * * * *